(12) United States Patent
Finlay et al.

(10) Patent No.: US 11,042,544 B2
(45) Date of Patent: Jun. 22, 2021

(54) DERIVED DATA DICTIONARY FOR OPTIMIZING TRANSFORMATIONS OF ENCODED DATA

(71) Applicant: International Business Machines Corporation, Armonk, NY (US)

(72) Inventors: Ian R. Finlay, Uxbridge (CA); Robert W. Lyle, Morgan Hill, CA (US)

(73) Assignee: International Business Machines Corporation, Armonk, NY (US)

( * ) Notice: Subject to any disclaimer, the term of this patent is extended or adjusted under 35 U.S.C. 154(b) by 237 days.

(21) Appl. No.: 16/210,049

(22) Filed: Dec. 5, 2018

(65) Prior Publication Data
US 2020/0183933 A1  Jun. 11, 2020

(51) Int. Cl.
*G06F 16/24* (2019.01)
*G06F 16/2453* (2019.01)
*G06F 16/22* (2019.01)
*H03M 7/40* (2006.01)
*G06F 16/23* (2019.01)

(52) U.S. Cl.
CPC ...... *G06F 16/24539* (2019.01); *G06F 16/221* (2019.01); *G06F 16/2282* (2019.01); *G06F 16/2365* (2019.01); *H03M 7/40* (2013.01)

(58) Field of Classification Search
CPC ............ G06F 16/24539; G06F 16/221; G06F 16/2282
See application file for complete search history.

(56) References Cited

U.S. PATENT DOCUMENTS

| | | | |
|---|---|---|---|
| 2009/0094236 A1 | 4/2009 | Renkes et al. | |
| 2014/0085115 A1* | 3/2014 | Beier | H03M 7/6023 341/106 |
| 2014/0250306 A1* | 9/2014 | Ziegler | G06F 8/60 713/189 |
| 2015/0363456 A1* | 12/2015 | Raman | G06F 16/282 707/693 |
| 2016/0085781 A1 | 3/2016 | Ellison et al. | |

* cited by examiner

*Primary Examiner* — Loc Tran
(74) *Attorney, Agent, or Firm* — Schmeiser, Olsen & Watts; Stephanie Carusillo

(57) ABSTRACT

A database-management system evaluates a query that retrieves and transforms encoded symbols stored in a database. If the stored symbols assume a relatively small set of distinct values, the system initially performs the transformation on every value in the set. During execution of subsequent queries, rather than performing the transformation upon every stored symbol fetched from the database, the system merely returns the previously derived encoded transformation results that correspond to the decoded value of each fetched symbol. If the symbols stored in the database span a relatively large set of distinct values, the system does not initially perform the transformation upon every value in the set. Instead, the first time the system fetches a symbol that has a particular value, it saves that symbol's encoded transformation result and reuses that result the next time it fetches an encoded symbol with the same value.

12 Claims, 6 Drawing Sheets

DERIVED DATA DICTIONARY FOR OPTIMIZING TRANSFORMATIONS OF ENCODED DATA

BACKGROUND

The present invention relates in general to database management systems (DBMS) and in particular to query optimization for encoded databases.

Data elements can be stored in a database for purposes like reducing storage requirements, improving privacy, or increasing the security of sensitive information. Encoding is performed by deterministic algorithms that translate a data element into an encoded data object called a "symbol." The original value of data element can be recovered from the encoded symbol by performing a complementary decoding procedure upon the symbol.

Data may be encoded by any means known in the art, such as by a fixed-length or variable-length derivative of Huffman-style coding, by fixed-length or variable-length dictionary coding, by a value-based numeric delta-coding algorithm (sometimes referred to as "minus coding" or "offset coding"), by any of the family of Lempel-Ziv compression technologies, or by a scalar coding algorithm.

Delta-coding algorithms encode an ordered sequence of data items, such as numbers, by first selecting a reference item from the sequence as a "base" value. The algorithm then encodes each subsequent item into a value equal to the difference between that subsequent item and the item that preceded the subsequent item.

For example, a delta-type encoding algorithm might initially select the first value of sequence (3, 1, 3, 5, −4) to be a base value. The algorithm would then encode each subsequent element in the sequence into a symbol equal to the difference between that subsequent element and the element that preceded the subsequent element. This would yield the sequence of encoded values (the first of which is the base value itself): (3, −2, 2, 2, −9). In some cases, the base value would be encoded as zero.

These mechanisms may also be adapted to encode a set of data items that each begin or end with one of a small number of possible prefixes or suffixes. For example, a column of Internet URLs that always begin with one of three possible prefixes "www," "http://www," and "https://www" could be stored more efficiently by encoding each stored prefix into a single-character symbol "1," "2," or "3."

Such encoded prefix/suffix symbols may be stored independently of a main portion of an encoded string. When requested to perform a transformation upon the entire string, the DBMS would precede the actual transformation by first fetching both the main portion and the prefix or suffix, decoding both, and then concatenating the two to reconstruct the original unencoded string.

One way in which known DBMS technology manages encoded data is by generating and maintaining a "data dictionary" data structure for each encoded column of a database table. The exact contents of a data dictionary are implementation-dependent, but in all cases, include a cross-reference that associates encoded values stored in the column with the original data items that correspond to each encoded value.

Each distinct value that is stored one or more times in the column is assigned one entry in the cross-reference table. Each entry associates one distinct encoded with a corresponding unencoded data item. The entries may be organized in an implementation-dependent order that depends upon technical constraints, implementation goals, and the implementer's choice of encoding technology. For example, the symbol values may be organized in order of frequency of occurrence, where the most commonly stored values occupying the earliest entries in the cross-reference table.

In one example, a database column stores symbols that each contain an encoded 9-digit Zip code. If that column contains 1000 instances of the symbol that each store one of 100 distinct encoded values, that column's data-dictionary cross-reference table would contain 100 entries. Each entry would identify one of the 100 distinct stored symbol values and would associate each value with the Zip code that is encoded into that symbol.

When a query, a complex query predicate, an invariant function, or another database-access function requests that an encoded column be transformed by a specified function or operation, known database engines can conserve resources by performing a quick lookup into the data-dictionary cross-reference that contains all or part of the transformation result. Such a lookup allows the DBMS to determine a decoded value of a fetched symbol far more efficiently than would be possible by performing a computational data-decoding procedure.

SUMMARY

Embodiments of the present invention comprise methods, systems, and computer program products to implement an improved DBMS query-processing system. This improved system processes queries that request the performance of a transformation upon data elements represented by encoded symbols stored in a column of a database. The system creates a derived data dictionary that stores the result of performing the transformation on each unique value represented by a symbol in the column. If the number of distinct values is relatively small relative to the total number of symbols stored in the column, including duplicates, the system initially performs the transformation on each distinct value and stores each result in the derived data dictionary. During subsequent query execution, rather than decoding each fetched symbol, performing the transformation upon the decoded value, and then optionally re-encoding the result, the system merely looks up previously derived results stored in the derived dictionary for the value of each fetched symbol. If the symbols stored in the database span a larger set of distinct values, the system does not initially perform the transformation upon every value in the set. Instead, the first time the system fetches a particular value, it saves the transformation result produced by performing the transformation upon that particular value and reuses the result the next time it fetches a symbol with the same value.

DETAILED DESCRIPTION

Figure 1:
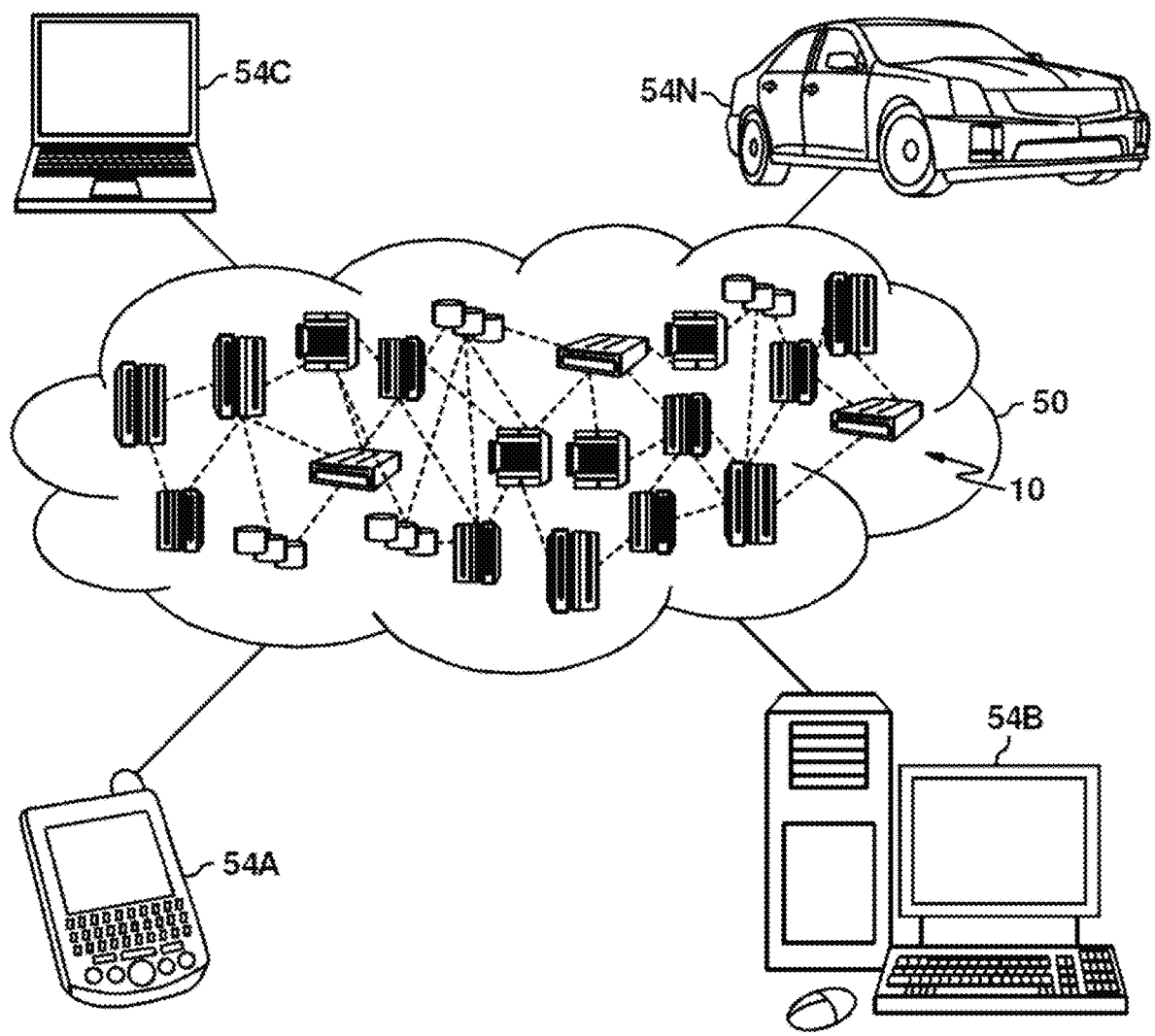
FIG. 1 depicts a cloud computing environment according to an embodiment of the present invention.

Embodiments of the present invention improve known DBMS technology by addressing disadvantages of known mechanisms by which a DBMS performs a requested transformation upon encoded data stored in a database column.

Known DBMS query processors service such a request by decoding each encoded symbol stored in the column, performing the transformation upon the decoded value, and then optionally, re-encoding the transformation result. Embodiments of the present invention improve upon this method by first deriving a table of the results that would be produced by performing the transformation upon each distinct value that can be decoded from an encoded symbol stored in the column. The result of applying the transformation to a symbol fetched from the column can then be retrieved from the derived table without requiring encoding, decoding, or actually performing the transformation operation. This approach improves the efficiency and performance of known DBMS query-processing technology because a lookup into a relatively small, possibly memory-resident, table requires less overhead than performing a larger number of computationally intensive decoding, transformation, and encoding operations.

A query or other database-access operation may require a DBMS to perform a transformation operation upon data values that have been encoded into symbols stored in a database column.

Known database engines respond to such a request by:

i) fetching the requested symbol from the column, ii) decoding the symbol into its original unencoded value by either performing a computation decoding operation or by looking up the unencoded value in a cross-reference table of a data dictionary, iii) performing the transformation upon the decoded value, iv) encoding the result of the transformation, and, if necessary, v) storing the result of the transformation.

Additional steps may be required when a query requests a transformation to be performed on data that has independently encoded prefixes or suffixes. After decoding both the main portion of a fetched data item and the data item's prefix or suffix, the DBMS must then concatenate the two decoded values before performing the transformation upon the resulting reconstructed data element.

These known encoded-DBMS technologies have significant disadvantages. They require repeated transformation operations to be performed upon what could be identical decoded values and may also require encoding and decoding operations to be repeatedly performed upon identical retrieved symbols. They may expose sensitive information in an unencoded form or compromise system-level optimizations built by a database engine to efficiently manage encoded data.

Embodiments of the present invention address these limitations through methods, systems, and computer program products that improve upon known encoded-database technology. These embodiments build a "derived" data dictionary (or "DDD") for each encoded column of a database table that is generated from information stored in the DBMS's standard data dictionary for that column. Like the data dictionary's cross-reference table, the DDD cross-references each distinct encoded value stored in a column with the symbol's corresponding unencoded data item. The DDD improves this mechanism by adding a third element to each entry that identifies the result of performing the requested transformation on that entry's decoded value.

Similarly, where known systems support encoding and decoding operators, embodiments of the present invention add a third operator that identifies the result of performing a particular transformation upon a particular encoded column by performing a lookup into a DDD cross-reference table created for the particular transformation and column. This lookup can be far more efficient than performing the same transformation upon every encoded symbol fetched from the column.

Elaborating upon the previous example cited in the BACKGROUND section, an embodiment would respond to a query made upon the Zip code database table by first copying the DBMS's 100-entry 9-digit Zip code cross-reference to a derived data dictionary. If the query requests a 5-digit truncation of each stored 9-digit Zip code, the DBMS's query-processing component would then apply a truncation operation to each decoded value stored in the 100-entry table and then store each truncated 5-digit result as a third data item to each entry. The system would then service the query by fetching each symbol from the column and, rather than looking up a decoded value of each fetched symbol and then transforming that decoded value, instead looks up the stored transformation result associated with the fetched symbol. In this example, this procedure would improve the known method of querying an encoded database by requiring at most 100 truncation operations, rather than 1000.

Other embodiments, described below and in the figures, generate similar advantages when used to improved other DBMS operations. For example, certain embodiments may be used to facilitate the performance of transformations on databases that use prefix or suffix encoding, or on an encoded database column that contains too many distinct symbol values to transform into a derived data dictionary before beginning to fetch data from the column.

Still other embodiments provide benefits to a DBMS when a transformation is initiated by DBMS itself, rather than being performed in response to an incoming query 405. For example, certain types of encoding technologies and DBMS-maintenance conventions require a DBMS to update one or more of its internal data dictionaries when tuples or rows of a table are added or deleted or when a routine maintenance activity redistributes data stored in a column. This occurs, for example, when an activity forces the DBMS to recompute values of stored symbols encoded by a delta encoding method or when a column's data dictionary sorts symbol values according to the number of times each value is stored in a column.

In cases that comprise a transformation that re-encodes a column because an event as changed the symbol values stored in that column, transformation optimizer 407 generates a derived data dictionary that associates each decoded value represented by an encoded symbol currently stored in the column with new, re-encoded, symbols that will represent the values after the column is re-encoded. Optimizer 407 then uses the DDD to transform encoded values stored in the current encoded column to the re-encoded values. This is performed by steps that, other than performing an inverted lookup into the DDD, are analogous to those described above:

i) fetching the original stored symbol value from the current column;

ii) decoding the fetched symbol into the decoded value represented by the encoded symbol;

iii) looking up the decoded value in the derived data dictionary and retrieving a revised, re-encoded symbol value that will correspond to the decoded value after the column is re-encoded; and iv) storing the re-encoded value in the column that is being re-encoded.

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Referring now to FIG. 1, illustrative cloud computing environment 50 is depicted. As shown, cloud computing environment 50 includes one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 1 are intended to be illustrative only and that computing nodes 10 and cloud computing environment 50 can communicate with any type of computerized device over any type of network and/or network addressable connection (e.g., using a web browser).

Figure 2:
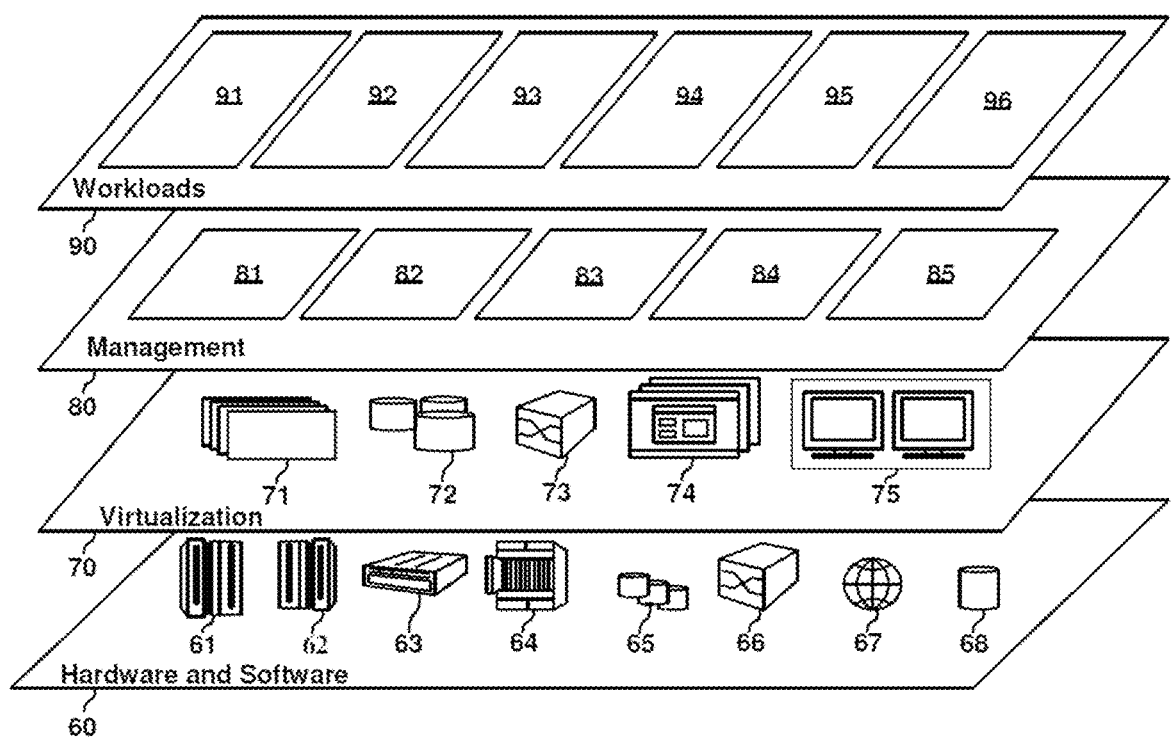
FIG. 2 depicts abstraction model layers according to an embodiment of the present invention.

Referring now to FIG. 2, a set of functional abstraction layers provided by cloud computing environment 50 (FIG. 1) is shown. It should be understood in advance that the components, layers, and functions shown in FIG. 2 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and orchestration of complex derived data dictionaries for optimizing transformations of encoded databases.

Aspects of the present invention may take the form of an entirely hardware embodiment, an entirely software embodiment (including firmware, resident software, micro-code, etc.) or embodiment combining software and hardware aspects that may all generally be referred to herein as a "circuit," "module," or "system."

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 3:
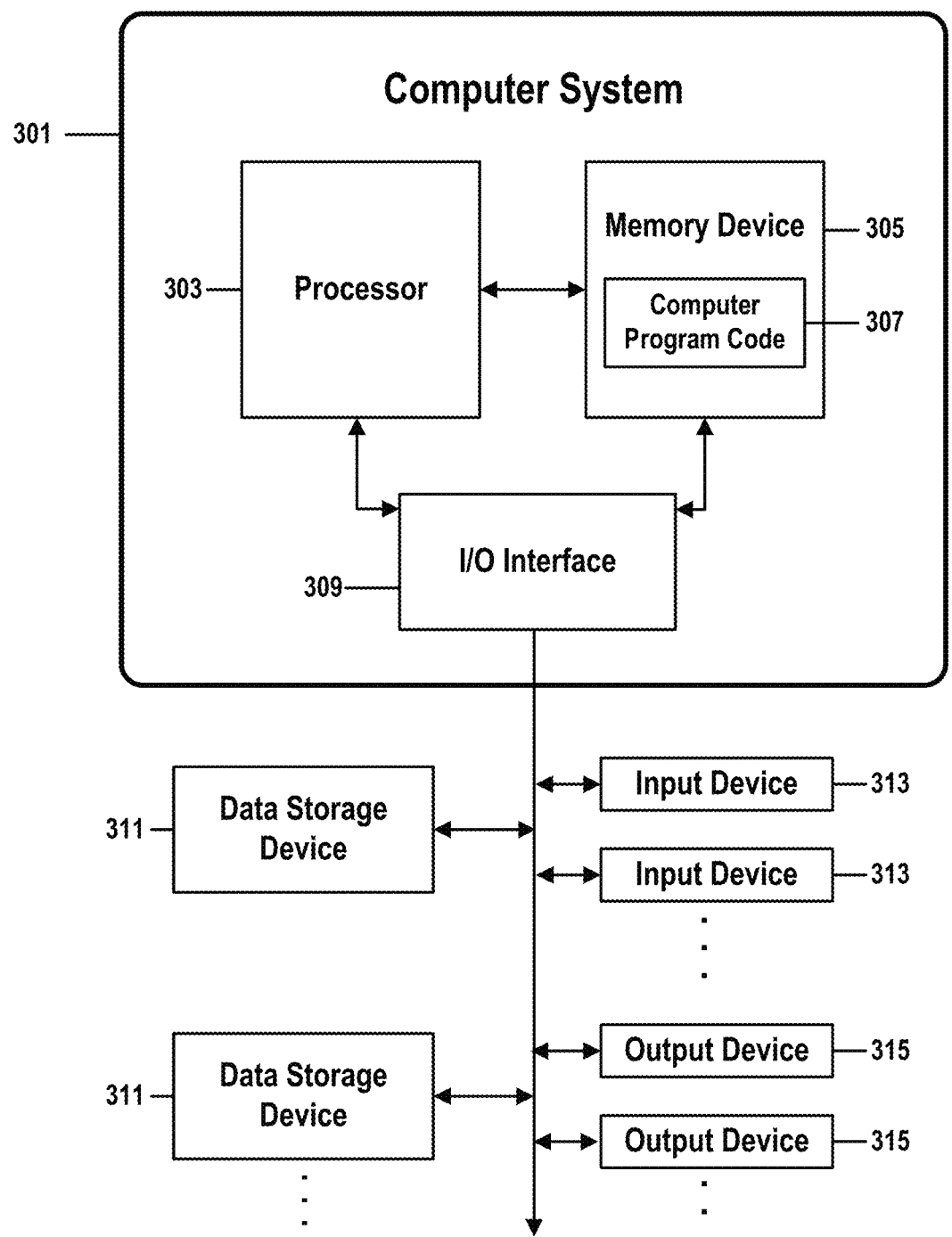
FIG. 3 shows the structure of a computer system and computer program code that may be used to implement a method for a derived data dictionary for optimizing transformations of encoded data in accordance with embodiments of the present invention.

FIG. 3 shows a structure of a computer system and computer program code that may be used to implement a method for a derived data dictionary for optimizing transformations of encoded data in accordance with embodiments of the present invention. FIG. 3 refers to objects 301-315.

In FIG. 3, computer system 301 comprises a processor 303 coupled through one or more I/O Interfaces 309 to one or more hardware data storage devices 311 and one or more I/O devices 313 and 315.

Hardware data storage devices 311 may include, but are not limited to, magnetic tape drives, fixed or removable hard disks, optical discs, storage-equipped mobile devices, and solid-state random-access or read-only storage devices. I/O devices may comprise, but are not limited to: input devices 313, such as keyboards, scanners, handheld telecommunications devices, touch-sensitive displays, tablets, biometric readers, joysticks, trackball's, or computer mice; and output devices 315, which may comprise, but are not limited to printers, plotters, tablets, mobile telephones, displays, or sound-producing devices. Data storage devices 311, input devices 313, and output devices 315 may be located either locally or at remote sites from which they are connected to I/O Interface 309 through a network interface.

Processor 303 may also be connected to one or more memory devices 305, which may include, but are not limited to, Dynamic RAM (DRAM), Static RAM (SRAM), Programmable Read-Only Memory (PROM), Field-Programmable Gate Arrays (FPGA), Secure Digital memory cards, SIM cards, or other types of memory devices.

At least one memory device 305 contains stored computer program code 307, which is a computer program that comprises computer-executable instructions. The stored computer program code includes a program that implements a method for a derived data dictionary for optimizing transformations of encoded data in accordance with embodiments of the present invention, and may implement other embodiments described in this specification, including the methods illustrated in FIGS. 1-6. The data storage devices 311 may store the computer program code 307. Computer program code 307 stored in the storage devices 311 is configured to be executed by processor 303 via the memory devices 305. Processor 303 executes the stored computer program code 307.

In some embodiments, rather than being stored and accessed from a hard drive, optical disc or other writeable, rewriteable, or removable hardware data-storage device 311, stored computer program code 307 may be stored on a static, nonremovable, read-only storage medium such as a Read-Only Memory (ROM) device 305, or may be accessed by processor 303 directly from such a static, nonremovable, read-only medium 305. Similarly, in some embodiments, stored computer program code 307 may be stored as computer-readable firmware 305, or may be accessed by processor 303 directly from such firmware 305, rather than from a more dynamic or removable hardware data-storage device 311, such as a hard drive or optical disc.

Thus the present invention discloses a process for supporting computer infrastructure, integrating, hosting, maintaining, and deploying computer-readable code into the computer system 301, wherein the code in combination with the computer system 301 is capable of performing a method for a derived data dictionary for optimizing transformations of encoded data.

Any of the components of the present invention could be created, integrated, hosted, maintained, deployed, managed, serviced, supported, etc. by a service provider who offers to facilitate a method for a derived data dictionary for optimizing transformations of encoded data. Thus the present invention discloses a process for deploying or integrating computing infrastructure, comprising integrating computer-readable code into the computer system 301, wherein the code in combination with the computer system 301 is capable of performing a method for a derived data dictionary for optimizing transformations of encoded data.

One or more data storage units 311 (or one or more additional memory devices not shown in FIG. 3) may be used as a computer-readable hardware storage device having a computer-readable program embodied therein and/or having other data stored therein, wherein the computer-readable program comprises stored computer program code 307. Generally, a computer program product (or, alternatively, an article of manufacture) of computer system 301 may comprise the computer-readable hardware storage device.

In embodiments that comprise components of a networked computing infrastructure, a cloud-computing environment, a client-server architecture, or other types of distributed platforms, functionality of the present invention may be implemented solely on a client or user device, may be implemented solely on a remote server or as a service of a cloud-computing platform, or may be split between local and remote components.

While it is understood that program code 307 for a method for a derived data dictionary for optimizing transformations of encoded data may be deployed by manually loading the program code 307 directly into client, server, and proxy computers (not shown) by loading the program code 307 into a computer-readable storage medium (e.g., computer data storage device 311), program code 307 may also be automatically or semi-automatically deployed into computer system 301 by sending program code 307 to a central server (e.g., computer system 301) or to a group of central servers. Program code 307 may then be downloaded into client computers (not shown) that will execute program code 307.

Alternatively, program code 307 may be sent directly to the client computer via e-mail. Program code 307 may then either be detached to a directory on the client computer or loaded into a directory on the client computer by an e-mail option that selects a program that detaches program code 307 into the directory.

Another alternative is to send program code 307 directly to a directory on the client computer hard drive. If proxy servers are configured, the process selects the proxy server code, determines on which computers to place the proxy servers' code, transmits the proxy server code, and then installs the proxy server code on the proxy computer. Program code 307 is then transmitted to the proxy server and stored on the proxy server.

In one embodiment, program code 307 for a method for a derived data dictionary for optimizing transformations of encoded data is integrated into a client, server and network environment by providing for program code 307 to coexist with software applications (not shown), operating systems (not shown) and network operating systems software (not shown) and then installing program code 307 on the clients and servers in the environment where program code 307 will function.

The first step of the aforementioned integration of code included in program code 307 is to identify any software on the clients and servers, including the network operating system (not shown), where program code 307 will be deployed that are required by program code 307 or that work in conjunction with program code 307. This identified software includes the network operating system, where the network operating system comprises software that enhances a basic operating system by adding networking features. Next, the software applications and version numbers are identified and compared to a list of software applications and correct version numbers that have been tested to work with program code 307. A software application that is missing or that does not match a correct version number is upgraded to the correct version.

A program instruction that passes parameters from program code 307 to a software application is checked to ensure that the instruction's parameter list matches a parameter list required by the program code 307. Conversely, a parameter passed by the software application to program code 307 is checked to ensure that the parameter matches a parameter required by program code 307. The client and server operating systems, including the network operating systems, are identified and compared to a list of operating systems, version numbers, and network software programs that have been tested to work with program code 307. An operating system, version number, or network software program that does not match an entry of the list of tested operating systems and version numbers is upgraded to the listed level on the client computers and upgraded to the listed level on the server computers.

After ensuring that the software, where program code 307 is to be deployed, is at a correct version level that has been tested to work with program code 307, the integration is completed by installing program code 307 on the clients and servers.

Embodiments of the present invention may be implemented as a method performed by a processor of a computer system, as a computer program product, as a computer system, or as a processor-performed process or service for supporting computer infrastructure.

Figure 4:
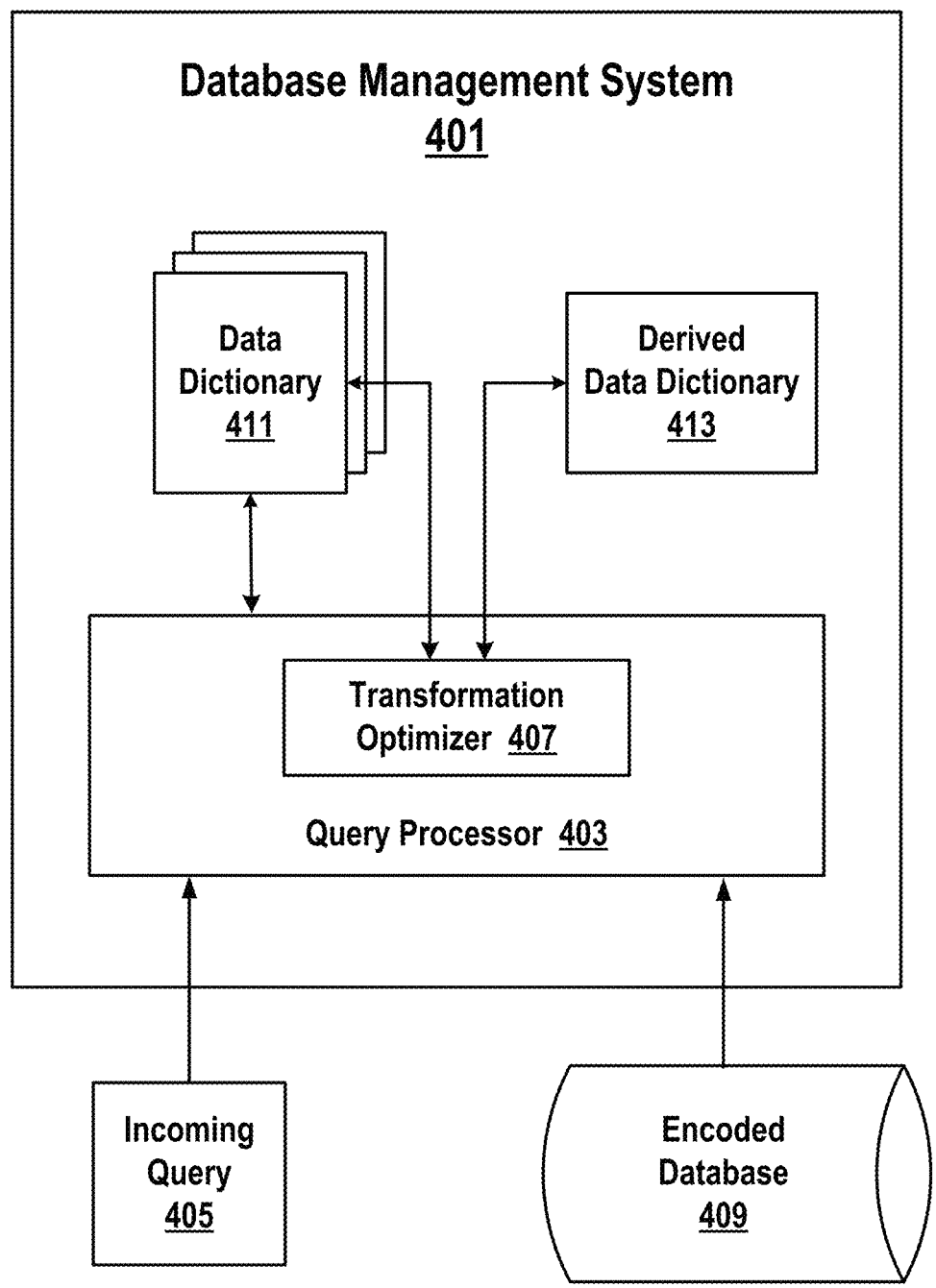
FIG. 4 shows the structure of a database management system that performs a method for a derived data dictionary for optimizing transformations of encoded data in accordance with embodiments of the present invention.

FIG. 4 shows the structure of a database management system 400 that performs a method for a derived data dictionary for optimizing transformations of encoded data in accordance with embodiments of the present invention. FIG. 4 shows items 401-413.

FIG. 4 shows a subset of the numerous modules comprised by DBMS 401. These modules include: a query processor 403 that receives, evaluates, and responds to incoming queries 405; a transformation optimizer 407 that optimizes the application of transformation operations, requested by a query 405, upon data encoded into a column of database 409; a data dictionary 411 that contains metadata describing encoded data items stored in encoded database 409; and a derived data dictionary (DDD) 413 containing metadata associated with a transformation to be performed upon a column of database 409.

Various modules of database 401 create and maintain one or more data dictionaries 411 and transformation optimizer 407 creates and maintains a DDD 413 for each incoming transformation operation performed upon a particular column of database 409. For a given transformation on a given column, an associated DUD 413 contains: a list of non-duplicative, distinct encoded values stored in the column; a decoded data element represented by each of the distinct encoded values; and the results of applying the transformation operation upon each of the decoded data elements.

In some embodiments, certain of these elements may be organized slightly differently. For example, DBMS 401 may maintain metadata about the entire encoded database 409 in a single data dictionary 411 or may maintain a distinct data dictionary 411 for each table or column of database 409. Transformation optimizer 407 may be implemented as a component of query processor 403 but in other embodiments, optimizer 407 may be a distinct DBMS module that is internal to DBMS 401 but external to query processor 403.

Similarly, in some embodiments, derived data dictionary 413 may contain the decoded data element of DBMS data dictionary 411 or a reference to the decoded data element of DBMS data dictionary 411. This latter option allows DDD 413 to avoid storing the decoded data element at all, instead allowing DDD 413 to access, as needed, a copy of the decoded data element stored in derived data dictionary 413, and using the distinct encoded value as an index into the derived data dictionary 413.

Certain embodiments may substitute DDD 413 for the DBMS's standard data dictionary 411 for the duration of the execution of incoming query 405. DDD 413 may also be saved as metadata maintained for use by the DBMS when servicing subsequent incoming queries 405. In a similar manner, the DBMS's standard data dictionary 411 may itself store the transformed decoded data element, either as a temporary data item either cached for the duration of the current operation or retained as archival data that is kept available for processing future incoming queries 405.

Regardless of implementation details, embodiments of the present invention improve known DBMS technology for managing an encoded database 409 by adding the transformation optimizer 407 and derived data dictionaries 413 to known DBMSs 401. Optimizer 407 improves known DBMS 401 technology by creating, managing, and manipulating metadata stored in DDD 413 to perform methods for optimizing requested transformation operations upon encoded data stored in database 409.

Figure 5:
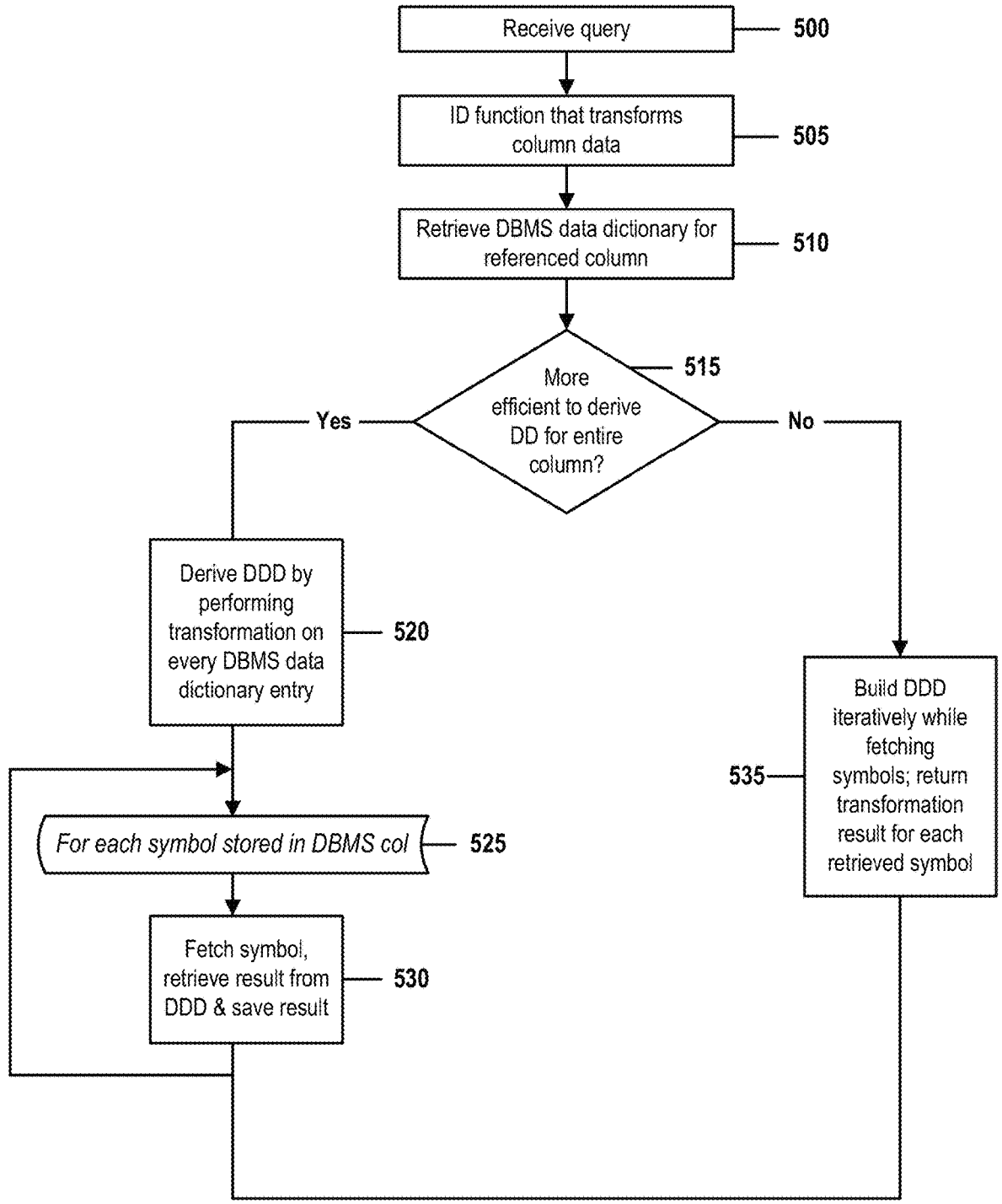
FIG. 5 is a flow chart that illustrates steps of a method for a derived data dictionary for optimizing transformations of encoded data in accordance with embodiments of the present invention.

FIG. 5 is a flow chart that illustrates steps of a method for a derived data dictionary for optimizing transformations of encoded data in accordance with embodiments of the present invention. FIG. 5 contains steps 500-535 which may be performed by embodiments that incorporate platforms similar to those described in FIGS. 1-4.

In step 500, a query processor 403 component of DBMS 400 receives a query 405 that requests the performance of a transformation upon a column of DBMS 400 that stores encoded symbols. Each symbol encodes a corresponding decoded value and multiple symbols in the column may store the same decoded value.

The symbols are encoded by any encoding technology known in the art that is deterministic. That is, performing successive encoding and decoding procedures on the same data element, using the same algorithm, key, and initialization vector (IV) or seed, will repeatedly produce the same encoded and unencoded values. If a delta-type encoding mechanism is selected, the encoded results can also be affected by the choice of a base value from which all other encodings are determined. In such a case, successively encoding and decoding a data element produces deterministic results only if the encoding and decoding operations are functions of the same base value.

In step 505, a transformation optimizer 407 component of the query processor 403 identities the transformation required by incoming query 405. This transformation must be of a type that can be performed deterministically on a string, numeric, date, time, Boolean, or other supported value, or on an expression that may be evaluated to one or more string, numeric, time, Boolean, or other supported values. The transformation must also be compatible with the particular class of encoding technology used by the DBMS 400 to encode the column.

For example, a wide range of transformations may be performed upon data encoded with any algorithm that complies with the general guidelines of dictionary encoding methods. For one such example, fixed dictionary Huffman-encoded CHAR and string data, functions that perform such transformations include: simple, known SQL (Structured Query Language) string transformations like RIGHT, LEFT, RTRIM, LTRIM, MID, SUBSTR, CONCAT, UPPER, LOWER, LENGTH, LOCATE, POSSTR, REPLACE, or TRANSLATE; time functions like DAY, DATE, MONTH, YEAR, HOUR, MINUTE, or SECOND; numeric or mathematical conversion functions, or mathematical operations; CAST operations; and determinate user-defined functions.

Similarly, a transformation performed upon dictionary-encoded numeric data can comprise any functions or operations that produce a consistent, pre-computable result, can be applied to data or metadata stored in a data dictionary 411 or in a derived data dictionary (DDD) 413, and that is format-compatible with the decoded value of the encoded symbol.

Such operations include: basic arithmetic and mathematical operations like addition, subtraction, multiplication, division, MOD, and REMAINDER; numeric conversion functions that perform operations like transforming an integer to a floating-point number or transforming a floating-point number to a decimal number; more advanced mathematical functions like square-root, exponentiation, and trigonometric functions; and numeric scalar functions like TRUNCATE, QUANTIZE, and ROUND.

If a numeric or string transformation requires one or more input values in addition to the encoded symbol retrieved from the column, those one or more values should be constants, literals, or dimensions that are encoded using the same encoding algorithm, primary and secondary keys, or seedily that are used to encode the column. That is, the one or more additional values should effectively act as constant factors relative to the value being computed by the transformation.

A more limited set of transformations may be performed upon data values that are encoded with a delta or offset-type encoding algorithm. As is known in the art, delta encoding generates encoded symbols as a function of a predetermined reference base value from which all other values are computed. Each unencoded value is encoded into a symbol that identifies the difference between the unencoded value and the base value. Delta encoding algorithms, therefore, are based on addition and subtraction operations.

For this reason, if a transformation TF comprises only functions that are transitive with addition and subtraction, an embodiment can transform an entire column of delta-encoded symbols by merely transforming the base value. This condition applies to any unencoded value S and base value BV if TF complies with the constraint:

$TF(BV+S)=TF(B)+S.$

Examples of such transitive transformations TF include:

$TF(X)=X+3,$ $TF(X)=0-X,$ and $TF(X)=X+MNTH(2)$ (where MNTH(2) is a two-digit representation of the current month).

If, on the other hand, a transformation TF is distributive, but not transitive, with a delta-encoding algorithm, it would satisfy the constraint:

$TF(BV+S)=TF(B)+TF(S).$

Embodiments of the present invention can only apply such transformations to a decoded value by applying the transformation to both the value itself and to the value's corresponding base value. Such transformations may be comprised by operations that require compatibility between two data dictionaries, such as a relational operation between two columns.

Embodiments that process databases encoded with scalar encoding algorithms may be subject to similar considerations. If, for example, a scalar encoding method consists of straightforward multiplication or division operations, transformations that are transitive or distributive over multiplication or division may be performed on encoded data objects in a similar manner Embodiments can also be applied to larger string database items encoded with any of the Lempel-Ziv family of lossless compression/decompression algorithms. Transformations comprising an invariant operation that may be completely and directly applied to static pre-populated 'primer' dictionaries used by an LZ decoder, and when applied to dynamic dictionaries, the transformation does not have to be reapplied by a subsequent request for the same transformation.

Other embodiments may comprise a transformation performed by the DBMS 400 itself on internally stored data used by the database to respond to a query. Examples of such applications include tasks like pre-evaluating query predicates, transcoding a column from one database table's data dictionary to another table's data dictionary, transcoding a column from the database table's current data dictionary to a new, replacement data dictionary for the same column, on-the-fly re-encoding of one or more previously encoded columns when performing a multi-column transformation (such as concatenating two columns or splitting a column of strings into a column of prefix substrings and a column of main-portion substrings), or re-encoding column data into a different data type.

At the conclusion of step 505, optimizer 407 will have, by means known in the art, extracted and isolated one or more transformations comprised by query 405. This transformation may range from the simple addition of a constant value to complex multi-predicate expressions that comprise a combination of numeric, string, date, time, logical, and table functions performed in stages upon multiple columns. The embodiments and examples of FIGS. 5-6 will, for pedagogical reasons, be limited to simple one-column transformations, but this simplification should not be construed to limit embodiments of the present invention to such transformations.

In step 510, the system identifies and retrieves the DBMS's data dictionary 411, which is used by DBMS 400 to manage data stored in the encoded column referenced by the transformation identified in step 505. As described above, this data dictionary 411 contains a cross-reference table that associates each distinct, encoded symbol value stored in the column with that symbol's equivalent decoded value. For example, if a column contains 1000 symbols, each of which store any of 35 possible values, that column's corresponding data-dictionary cross-reference would contain 35 entries, each of which associates one of the 35 possible encoded symbol values with the decoded value represented by that symbol.

In step 515, optimizer 407 uses implementation-dependent criteria to select a transformation strategy. A strategy may comprise either transforming every distinct value in the cross-reference table before fetching any symbols from the encoded column, or else transforming each distinct symbol value on-the-fly the first time that particular symbol value is fetched from the column. In either case, one instance of each distinct transformation result will be stored in the DDD 413's cross-reference table.

If optimizer 407 determines in this step that it is would be more efficient or otherwise more desirable to initially transform the data-dictionary's entire cross-reference table and store the results in the DDD cross-reference table before beginning to fetch column data, the method of FIG. 5 performs steps 520-530. If optimizer 407 determines instead that the alternative iterative approach (generating and saving distinct transformation results value on the fly while fetching data from the column) is more efficient or desirable, then the method of FIG. 5 continues with step 535 and FIG. 6.

This determination may be made by any means known in the art or as a function of an implementer's expert knowledge of database conventions, local technical constraints, business goals, system usage patterns, database performance or utilization figures, or other implementation-dependent factors culled from system logs, technical documentation, or other known information sources.

For example, if an implementer knows the average time required for the DBMS to perform certain operations (such as fetching data from a column, encoding or decrypting a fetched data item, or performing certain types of transformation on a decrypted data item) and also knows the maximum query response time that is acceptable to users, the implementer could estimate a "break-even" point that identifies the maximum percent of distinct values stored in a column that could justify selecting a full-table transformation strategy.

It is not essential that an implementer initially select optimal criteria for making this determination. Because a complex combination of time-varying factors may determine the performance, response times, and resource-utilization of a real-world DBMS, a single educated guess is unlikely to be optimal. It is more likely that optimized criteria would be identified over time through analysis, machine-learning, or other artificial-intelligence technologies, on an iterative fine-tuning process based on logs, reports, and operational statistics that track the DBMS's response times and other performance parameters.

An implementer might, for example, make an initial arbitrary decision that, if the number of distinct, non-duplicated values stored in a column is less than 20% of the total number of data values stored in that column, then the entire DBMS data dictionary cross-reference table should be initially transformed by the procedure of steps 520-530. This decision would be based on the assumption that generating the DDD's derived table would require only 20% of the transformation operations that would be required by known methods that would transform every symbol fetched from the column.

In some cases, the total number of items stored in a column might not be known at the time when step 515 is performed. An implementer might then make an initial arbitrary decision that, if the number of distinct, non-duplicated values stored in a column is less than 20% of the total number of data values that are expected to be stored in that column, then the entire DBMS data dictionary cross-reference table should be initially transformed by the procedure of steps 520-530. This expectation may be made by any means known in the art, such as by reviewing a historical record of the total number of items stored in the column in the past, or technical, business, or logged information that provides an average (or other predictable estimated) number that is likely to be approximately correct.

Figure 6:
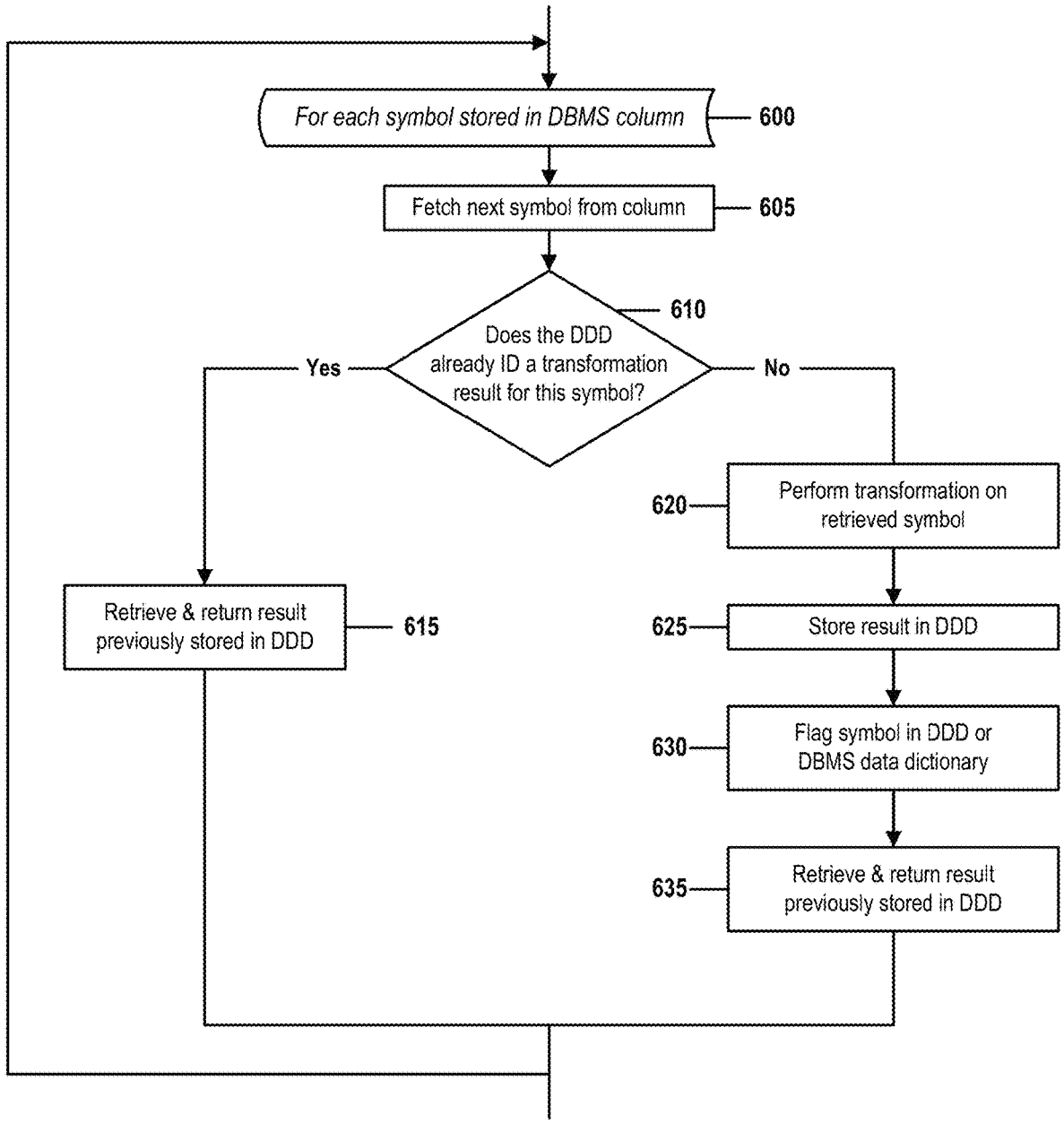
FIG. 6 is a flow chart that illustrates details of a method for creating the derived data dictionary of FIG. 5 through an incremental process.

In another example, an implementer might make an initial arbitrary decision that, if a column stores more than 500 distinct, non-duplicated values, then optimizer 407 should build the DDD cross-reference table iteratively through the procedure of step 535 and FIG. 6. This decision would be based on an assumption that the average amount of time required to perform 500 transformations of a certain type would result in the maximum response time acceptable to users of the DBMS.

In either case, the implementer would then periodically adjust the initial 20% break-even point or the 500-value ceiling and evaluate any changes in the DBMS's performance that occur after each revision. Eventually, these adjustments would result in the break-even point or the ceiling converging to an optimal value.

Criteria to consider when making this determination can include:

The number of distinct values stored in a column relative to the total number of values stored in the column. An embodiment is less likely to produce benefits by transforming all distinct values stored in a column if that column contains almost no duplicated values. If, for example, a table contains 1000 entries, 600 of which are distinct values each stored only once in the column, transforming those 600 distinct values would take a significant amount of time relative to the time required to transform all 1000 entries. In that case, optimizer 407 would in step 515 determine that the iterative procedure of step 535 and FIG. 6 in more likely to produce better results than would the procedure of steps 520-530.

If a column contains very few duplicate values, optimizer 407 might be configured to direct the DBMS to revert to a known transformation method. This might occur if the criteria indicate that the embodiment would not eliminate enough transformations to offset the overhead of creating and maintaining the DDD and of performing repeated lookups into the DDD table.

Column and table characteristics like table size, result-set size, dictionary size, and symbol size can affect the duration of time necessary to perform operations like fetching data from a column, storing data in the column, encoding or decoding a data item, and performing a transformation of a data item. For this reason, these characteristics can affect a determination of which transformation strategy is more efficient.

The nature of the transformation can similarly affect the amount of time required to perform the transaction on a data item. Very short transformation times reduce the benefit of choosing a transformation strategy that minimizes the number of required transformations.

The efficiency of an encoding/decoding algorithm can also affect the amount of time required to perform the transaction on a data item. Very short transformation times reduce the benefit of choosing a transformation strategy that minimizes the number of required transformations.

Selection of a particular class of encoding technology, and the relationship between that technology and, in the case of delta coding, the existence or nonexistence of transitive or distributive properties of a transformation, can affect the relative efficiency of the two possible transformation strategies. As explained above, certain combinations of encoding technology and transformation may allow an entire column to be transformed by merely transforming a single base value. Other combinations require the base value to be transformed in addition to transforming other values stored in a column.

If a transformation, or another operation comprised by a query or performed by the DBMS 400, requires additional computations to be performed upon the encoded value of the transformation result, embodiments can improve DBMS efficiency and avoid redundant operations by storing those encoded results in the DDD cross-reference table. Furthermore, storing the results in encoded form can reduce storage requirements when an encoding algorithm encodes data into a compressed form.

In step 520, optimizer 407, having determined that it is more efficient or otherwise desirable to generate an entire cross-reference table in a derived data dictionary (DDD) before fetching data from the column, begins generating a DDD table for that column and for the requested transformation.

The DDD table may optionally include or reference data stored in the DBMS's standard data dictionary table, which contains one entry for each distinct encoded symbol stored in the column. Each entry associates that encoded symbol with the decoded value represented by the symbol.

After optionally copying these items to the DDD's derived table, optimizer 407 performs the transformation upon each decoded value stored in either the derived table or in the DBMS's original data-dictionary table and then stores the result of the transformation in the derived table.

If the combination of encoding algorithm and transformation satisfy certain distributive or transitive constraints similar to those described above, some embodiments may instead transform the encoded symbol and then store the encoded result in the derived table. In yet other embodiments, optimizer 407 may generate both encoded and decoded transformation results and then store both in the derived table.

At the conclusion of step 520, components of DBMS 400 will have generated a derived data dictionary that is specific to the particular column and transformation. This DDD contains a derived cross-reference table and each entry of this table identifies one distinct or unique encoded symbol stored in the column, a decoded value encoded into that symbol, and a transformation result that would be produced by performing the transformation upon the value of the encoded symbol, upon the value of the decoded data element represented by the symbol, or upon both.

Because the derived table contains only one entry for each distinct value stored in the column, if a column stores five instances of the same value, that same value will generate only one entry in the DBMS's cross-reference table and only one entry in the DDD's derived table. This mechanism allows the derived table to represent every possible transformation result that could be produced by applying the transformation upon any symbol stored in the column, and to do so in what can be a much smaller number of entries than the total number of symbols stored in the column.

Step 525 initiates an iterative procedure of steps 525-530. Each iteration of this procedure fetches one encoded symbol from the column and returns a result that would be generated by performing the transformation upon the fetched symbol. The iterative procedure ends when every symbol stored in the column has been fetched and processed.

In step 530, transformation optimizer 407 identifies a result that would be produced by applying the transformation upon the fetched symbol being processed by the current iteration of steps 525-530.

This procedure does not require an encoding or decoding step. Instead, optimizer 407 looks up the entry of the DDD's derived cross-reference table that corresponds to the value of the fetched encoded symbol. Optimizer 407 then returns the corresponding encoded or decoded result stored in that entry. An embodiment may be configured to return either an encoded or a decoded result as a function of a particular implementation goal, of a characteristic of the design of DBMS 400, of a requirement of the query, of the type of transformation, of the data type of the column or of multiple columns referenced by the query, or of any other characteristic deemed relevant by an implementer. The present invention is flexible enough to accommodate embodiments capable of handling any of these conditions.

At the conclusion of the last iteration of steps 525-530, the transformation optimizer 407 will have returned to query processor 403 a set of transformation results. Each data item of this result set will be a value that would be generated by applying the transformation upon one of the symbols (or upon a decoded value represented by one of the symbols) stored in the column. Query processor 403 then stores the returned results in database 409 or forwards the results to other modules of DBMS 400, to the originator of query 405, or to a downstream system for further processing.

Some embodiments may delete the derived data dictionary upon completion of a procedure of FIG. 5, but others may retain the DDD if there is a likelihood that another query may request a same transformation to be performed upon the same column. In effect the improved DBMS 400 would in such embodiments, "cache" the encoded or decoded values associated with the column for use with subsequent queries 405. In such cases, when a subsequent query 404 arrives, optimizer 407 may need to update the cached DDD 413 stored in the DDD to match the current version of the corresponding cross-reference table stored in the DBMS's data dictionary 411 for the column.

The method of FIG. 5 can be illustrated by the following example.

Consider a query that includes the predicate:

SELECT UPPER(T1.C1) FROM T1

Here, the predicate performs an UPPER transformation (converting lower-case characters to upper case) on string data encoded into symbols stored in encoded column C1 of database table T1.

Table 1 shows a cross-reference table comprised by standard data dictionary for column C1, where that table associates each distinct encoded symbol stored in C1 with that symbol's corresponding decoded string.

TABLE 1

| Symbol | Decoded String |
|---|---|
| 1 | Ontario |
| 2 | Quebec |
| 3 | British Columbia |

Table C1 contains eight rows that contain the encoded symbols shown in Table 2.

TABLE 2

| C1 Row | Symbol |
|---|---|
| 1 | 2 |
| 2 | 1 |
| 3 | 1 |
| 4 | 1 |
| 5 | 3 |
| 6 | 2 |
| 7 | 3 |
| 9 | 2 |

Performing the UPPER transformation on column C1 with known query-processing methods returns eight string values, each of which is an upper-case transformation of a string represented by an encoded symbol stored in C1:

QUEBEC
ONTARIO
ONTARIO
ONTARIO
BRITISH COLUMBIA
QUEBEC
BRITISH COLUMBIA
QUEBEC

Each of these results would be generated by:
i) fetching a symbol from C1;
ii) retrieving from the DBMS's data dictionary the decoded value that corresponds to the fetched symbol;
iii) applying the UPPER transformation upon the decoded value;
iv) optionally re-encoding the resulting string if that string needs to be stored in encoded database 409; and
v) storing the results or forwarding the results to the query originator or to a software application.

Embodiments of the present invention would implement a streamlined procedure that requires fewer steps and less resource-intensive operations. First, transformation optimizer 407 would determine that the number of distinct values encoded into C1 is much less than the total number of symbols stored in C1. Based on this determination, optimizer 407 would initially generate a DDD derived cross-reference table comprising every distinct value stored in C1.

This derived table would be generated by importing or referencing the standard table comprised by the DBMS's data dictionary into the optimizer 407's derived data dictionary. Optimizer 407 would then preform the UPPER function upon every decoded value stored in the derived table or read from the reference to the DBMS's data dictionary, and save the results of each transformation in a column of the table. The result is shown below as Table 3.

TABLE 3

| Symbol | Decoded String | Transformation Result |
|---|---|---|
| 1 | Ontario | ONTARIO |
| 2 | Quebec | QUEBEC |
| 3 | British Columbia | BRITISH COLUMBIA |

Transformation optimizer 407 would then perform the following procedure for each encoded symbol stored in C1 in order to return the same result set that would be generated by the more complex, less-efficient known procedure enumerated above.

i) fetch the symbol from C1;
ii) identify, in the derived table, a transformation result that corresponds to the fetched symbol;
iii) optionally re-encode the results if those results need to be stored in encoded database 409 and if the transformation of step ii) does not include the re-encoding; and
iv) store) the results or forward the results to the query originator or to a software application.

If an embodiments known to be required to return an encoded result, final encoding step iii) can be eliminated if the encoded results are added to each entry of the derived cross-reference table. This would then allow optimizer 407 to retrieve the encoded results directly from the derived table, rather than repeatedly encoding each retrieved decoded result. In such cases, no encoding or decoding operations would need to be performed once the derived table is created.

In certain embodiments, an alternative DDD implementation might contain a newly encoded result generated by performing the transformation upon the original distinct encoded symbol. This newly encoded result could then be used to reference decoded transformed values saved in a second derived dictionary. By saving and relating a decoded transformed value and its corresponding encoded transformed value, such embodiments provide an additional advantage. For example, if applying a transformation to an entire column produces numerous duplicate results, those results would otherwise need to be repeatedly re-encoded before forwarding the encoded results to other components of query processor 403.

FIG. 6 is a flow chart that illustrates details of a method for creating the derived data dictionary of FIG. 5 through an incremental process. FIG. 6 contains steps 600-635, which in turn elaborate step 535 of FIG. 5.

Step 600 begins an iterative procedure of steps 600-635. This procedure is performed once for every encoded symbol stored in the column to be transformed. As described in FIG. 5 and in the preceding examples and text, each of these encoded symbols is an encoding of a decoded value and optimizer 407 has begun to derive a data dictionary specific to the column and to the transformation to be performed upon each value stored encoded into the column. Symbols stored in the column may contain duplicate values, but derived data dictionary (DDD) contains a derived table that cross-references each distinct, unique encoded symbol value stored in the column with that symbol's corresponding decoded value.

The remainder of the method of FIG. 6 is directed to further populating each entry of that table with the result of applying the transformation on the distinct value identified by that entry and by further optionally adding to each entry a transformation flag that indicates whether the value has already been subjected to a transformation that has produced a transformation result.

This procedure is subject to the constraints described above and in FIG. 5 and is capable of being extrapolated to the variant embodiments described above and in FIG. 5. For example, an embodiment might store into an entry of the derived table the result of applying the transformation to that entry's decoded value. Another embodiment might store into the entry the result of applying the transformation to that entry's encoded symbol.

In step 605, optimizer 407 fetches the next encoded symbol S stored in the column. This encoded symbol S represents a decoded value D.

In step 610, the system determines whether the DDD table already contains an entry that identifies the result of applying the transformation to S. This determination may be made by any means known in the art. For example, optimizer 407 may search an indexable column of the derived cross-reference table to retrieve the record that corresponds to encoded value S. Optimizer 407 would then determine whether a field of that record that would store a previously computed transformation result is empty. If that field contains no data, then the system would conclude that the current symbol is the first instance of the value S to be fetched.

Similarly, each entry of the derived table could instead be characterized by a Boolean variable or a flag, either incorporated into the entry as an additional field or stored in an independent data structure. In such embodiments, the system would set a flag associated with a particular symbol value when the transformation is applied to that value and the transformation result stored in the derived table's entry for that value. The flag would thus be an efficient way to determine whether the result of transforming a particular fetched value has already been derived and stored.

If optimizer 407 in this step determines that the DDD table already contains a transformation result for fetched symbol S, the method of FIG. 6 continues with step 615. In this case, optimizer 407 concludes that another symbol with the same value as S has already been fetched from the column and transformed, and that the result of that transformation can be retrieved from the DDD.

If, however, optimizer 407 determines that the DDD table does not already contain a transformation result for fetched symbol S, the method of FIG. 6 continues with steps 620-635.

In step 615, optimizer 407 retrieves the DDD entry for the distinct value stored in symbol S, retrieves the transformation result that would be generated by applying the transformation upon corresponding decoded value D and returns that transformation result to a query originator, to a component of the DBMS, to a downstream system or application, or to any other entity to which the results of query 405 should be directed.

In some embodiments, an analogous procedure is performed on encoded symbol S, rather than on decoded value D and the result of that procedure, encoded or not, is returned. As described in FIG. 5 and above, embodiments of the present invention may operate exclusively upon encoded values when an implementation comprises certain classes of transformation and certain encoding technologies.

In step 620, optimizer 407, having determined in step 610 that no symbol fetched during a previous iteration of the method of FIG. 6 had the same value as symbol S, performs the transformation upon either the encoded value S, upon the decoded value D, or upon both.

In step 625, optimizer 407 adds the transformation results in the entry of the DDD derived cross-reference table that corresponds to the value of symbol S.

In step 630, embodiments that comprise transformation flags would set the flag that corresponds to the value of symbol S. This would indicate that the system has already computed and stored the result of performing the transformation on the value of S. If another symbol S1, equal to 5, is fetched from the column in a future iteration of FIG. 6, optimizer 407 will in step 610 interpret this set flag as an indication that, because an equivalent transformation result already exists, there is no need to reapply the transformation upon S1.

In step 635, optimizer 407 returns the result of applying the transformation to symbol S to a query originator, to a component of the DBMS, to a downstream system or application, or to any other entity to which the results of query 405 should be directed.

At the conclusion of the final iteration of the procedure of steps 600-635, the system will have added a transformation result to every entry, of the DDD's derived cross-reference table, that has been referenced by a symbol retrieved for the column. This procedure may generate an instantiation of the entire DDD 413's derived cross-reference table, or may generate only a partial instantiation of the DDD 413's derived cross-reference table. The system may also have set a flag variable for every entry of the table, indicating that transformations have been stored for every distinct value accessed and stored in the column.

Stored results may be encoded, unencoded, or both. An embodiment might, for example, require both formats if the results of a transformation are to be stored in encoded form in database 409 and also displayed on a monitor to a user in unencoded form.

Control is then transferred back to the method of FIG. 5, where the algorithm terminates.

Certain embodiments of the present invention may, as described above, be applied to transformations performed upon prefix-encoded or suffix-encoded columns, where a data dictionary identifies metadata of encoded values of a prefix or suffix of a stored data item.

Prefix/suffix-encoding can provide benefits when a column of data items all start or end with one of only a limited number of possible prefixes or suffixes. For example, Internet Uniform Resource Locator strings could each comprise a variable main portion of the URL preceded by one of three possible prefixes "www," "http://www," and "https://www."

Each of these three prefix values could be stored efficiently by encoding the prefix into a single-character symbol "1," "2," or "3" independently of each string's main portion.

Such encoded prefix/suffix symbols may be stored independently of a main portion of an encoded string or may be managed by a DBMS data dictionary containing a cross-reference table describing only the prefix or suffix portion of each URL. In some cases, prefix or suffix values may not be stored at all in a database column, and may instead each be identified solely by a data dictionary entry that associates an encoded symbol representing the prefix or suffix with a lain-portion substring stored in the database.

When requested to perform a transformation upon the entire string, known DBMS query processors would fetch the main-portion substring, identify a corresponding prefix or suffix substring, use each substring's respective data dictionary to decode either or both substrings as required, concatenate the two substrings to reconstruct the original unencoded string, and then perform the requested transformation upon the reconstituted string. Certain known DBMS's may also be designed or configured to perform implementation-dependent variations of this procedure in order to manage prefix or suffix data encoded in this manner.

Embodiments of the present invention analogous to those of FIGS. 5 and 6 may be used to improve the performance of transformations performed upon these types of prefix-encoded or suffix-encoded database columns. Such embodiments may perform a transformation by manipulating only data stored in a derived data dictionary, using procedures similar to those of FIGS. 5 and 6; or may manipulate both the DDD table entries and also fetched prefix, suffix, or main-portion substrings that had been stored in the database 409. As with previously described embodiments, the exact implementation details, including any constraints on transformation/encoding-technology combinations, can depend on the data type of encoded data, the type of encoding algorithm used to encode that data, and the class of requested transformation to be performed upon the data.

As with non-prefix/suffix encoding, embodiments of the present invention that process character-type or string-type encoded columns may apply any transformation that produces complete, consistent, deterministic, pre-computable results. Supported functions include known SQL operators like RIGHT, LEFT, RTRIM, LTRIM, MID, SUBSTR, CONCAT, UPPER, LOWER, LENGTH, LOCATE, POSSTR, REPLACE, and TRANSLATE; time functions like DAY, DATE, MONTH, YEAR, HOUR, MINUTE, or SECOND; numeric conversion functions; CAST operations; and determinate user-defined functions.

Embodiments that comprise performing these transformations upon character-type, string-type or binary-type prefix/suffix-encoded data may perform a transformation on the DBMS's data-dictionary entries, to generate a derived data dictionary (DDD) similar to the DDD described in FIGS. 5-6. When performing other types of transformations, however, similar embodiments may also need to perform those transformations upon actual encoded symbols fetched from the database 409 or upon the unencoded portions associated with those fetched symbols.

Similarly, embodiments can perform a transformation comprising functions or operations that produce a consistent, deterministic, pre-computable result, upon prefix- or suffix-encoded numeric data can by either manipulating data or metadata stored in a data dictionary 411 or in a derived data dictionary 413.

Such transformation operations include: basic arithmetic and mathematical operations like addition, subtraction, multiplication, division, MOD, and REMAINDER; numeric conversion functions the perform operations like transforming an integer to a floating-point number or transforming a floating-point number to a decimal number; more advanced mathematical functions like square-root, exponentiation, and trigonometric functions; and numeric scalar functions like TRUNCATE, QUANTIZE, and ROUND.

If a numeric or string transformation requires one or more input values in addition to the encoded symbol retrieved from the column, those one or more values should be constants, literals, or dimensions that are encoded using the same encoding algorithm, primary and secondary keys, or seed/IV that are used to encode the column. That is, the one or more additional values should effectively act as constant factors relative to the value being computed by the transformation.

Under certain conditions, purely mathematical transformations may also be performed upon prefix-encoded or suffix-encoded columns that are encoded with a delta or offset-type encoding algorithm. As in embodiments described above that comprise non-prefix/suffix delta encoding, applying certain types of such transformations may require applying a transformation to only an encoded base value of a set of encoded prefixes and suffixes. In other cases, however, a transformation will need to be performed upon both the base value and the actual stored values. These constraints may be identified by any person skilled in the art of computational mathematics or functional analysis who is familiar with methods for combining functions that have transitive or distributive properties.

Examples and embodiments of the present invention described in this document have been presented for illustrative purposes. They should not be construed to be exhaustive nor to limit embodiments of the present invention to the examples and embodiments described here. Many other modifications and variations of the present invention that do not depart from the scope and spirit of these examples and embodiments will be apparent to those possessed of ordinary skill in the art. The terminology used in this document was chosen to best explain the principles underlying these examples and embodiments, in order to illustrate practical applications and technical improvements of the present invention over known technologies and products, and to enable readers of ordinary skill in the art to better understand the examples and embodiments disclosed here.

What is claimed is:

1. A DBMS query-processing system comprising a processor, a memory coupled to the processor, and a computer-readable hardware storage device coupled to the processor, the storage device containing program code configured to be run by the processor via the memory to implement a method for a derived data dictionary for optimizing transformations of encoded data, the method comprising:

the system receiving a query expressly requesting a transformation to be performed upon encoded symbols stored in a database column, where performing the transformation upon any encoded symbol does not require decoding the any encoded symbol upon which the transformation is performed, where each encoded symbol value corresponds to a corresponding unencoded value, and where at least two of the encoded symbol values are indistinguishable;

the system generating a derived data dictionary (DDD) table in which each entry associates one distinct encoded symbol value stored in the column with a corresponding transformation result, where a value of a first transformation result is equal to an output value produced by performing the expressly requested transformation upon a value of a first encoded symbol associated by the DDD table with the first transformation result;

the system selecting a DDD-generation strategy from the group consisting of:
  initially populating the DDD table, before fetching any symbols from the column, by adding to each table entry a transformation result derived by performing the transformation upon a symbol value identified by the entry, where the initially populating further comprises: performing the transformation on each distinct symbol value listed in the DDD table; and storing a result of each transformation as a transformation result in a DDD table entry that identifies a corresponding value upon which the transformation was performed; and
  incrementally populating the DDD table by adding, to a table entry that identifies a value of a fetched symbol, a transformation result derived by performing the transformation upon the identified symbol value only if a value of the fetched symbol is not equal to a value of any previously fetched symbol, where the incrementally populating further comprises: fetching the first symbol from the database column; determining whether an existing DDD table entry associates a value of the first symbol with the first transformation result; and if determining that no DDD table entry associates the value of the first symbol with the first transformation result, performing the transformation on the value of the first symbol and storing the result of the performed transformation as the first transformation result in the DDD table entry associated with the first symbol; and the system returning, for each symbol stored in the column, a corresponding returned result, where a returned result corresponding to a particular symbol is equal to a transformation result associated, by a DDD table entry, with a value of the particular symbol.

2. The system of claim 1, where the DDD table is initialized as a duplicate of a cross-reference table created and maintained by the DBMS, where each entry of the cross-reference table associates one distinct symbol value stored in the column with that distinct symbol's corresponding unencoded value.

3. The system of claim 1, where the selecting a DDD-generation strategy comprises comparing a total number of symbols stored in the column to a total number of distinct symbol values stored in the column.

4. The system of claim 1, where the encoded symbols stored in the database column each represent a prefix or suffix substring of a full string that comprises one instance of the prefix or suffix substring and a corresponding base string represented by an encoded base-string symbol, the method further comprising: fetching a first encoded substring symbol from the database column and a corresponding first encoded base-string symbol from a second column of the database; performing the transformation on the first encoded base-string symbol; and reconstituting the first full string by concatenating a decoded transformed substring represented by the first encoded substring symbol with a decoded transformed base string represented by the result of performing the transformation on the first encoded base-string symbol.

5. A method comprising:
a DBMS query-processing system receiving a query expressly requesting a transformation to be performed upon encoded symbols stored in a database column,
  where performing the transformation upon any encoded symbol does not require decoding the any encoded symbol upon which the transformation is performed,
  where each encoded symbol value corresponds to a corresponding unencoded value,
  where at least two of the encoded symbol values are indistinguishable; the system generating a derived data dictionary (DDD) table,
  where the DDD table is initialized as a duplicate of a cross-reference table created and maintained by the DBMS,
  where each entry of the cross-reference table associates one distinct symbol value stored in the column with that distinct symbol's corresponding unencoded value,
  where each entry of the DDD table associates one distinct encoded symbol value stored in the column with a corresponding transformation result, and
  where a value of a first transformation result is equal to an output value produced by performing the expressly requested transformation upon a value of a first encoded symbol associated by the DDD table with the first transformation result;

the system selecting a DDD-generation strategy from the group consisting of:
  initially populating the DDD table, before fetching any symbols from the column, by adding to each table entry a transformation result derived by performing the transformation upon a symbol value identified by the entry, where the initially further comprises: performing the transformation on each distinct symbol value listed in the DDD table; and storing a result of each transformation as a transformation result in a DDD table entry that identifies a corresponding value upon which the transformation was performed; and
  incrementally populating the DDD table by adding, to a table entry that identifies a value of a fetched symbol, a transformation result derived by performing the transformation upon the identified symbol value only if a value of the fetched symbol is not equal to a value of any previously fetched symbol, where the incrementally populating further comprises: fetching the first symbol from the database column; determining whether an existing DDD table entry associates a value of the first symbol with the first transformation result; and if determining that no DDD table entry associates the value of the first symbol with the first transformation result, performing the transformation on the value of the first symbol and storing the result of the performed transformation as the first transformation result in the DDD table entry associated with the first symbol; and the system returning, for each symbol stored in the column, a corresponding returned result, where a returned result corresponding to a particular symbol is equal to a transformation result associated, by a DDD table entry, with a value of the particular symbol.

6. The method of claim 5, where the initially populating further comprises: performing the transformation on each distinct symbol value listed in the DDD table; and storing a result of each transformation as a transformation result in a DDD table entry that identifies a corresponding value upon which the transformation was performed.

7. The method of claim 5, where the selecting a DDD-generation strategy comprises comparing a total number of symbols stored in the column to a total number of distinct symbol values stored in the column.

8. The method of claim 6, where the encoded symbols stored in the database column each represent a prefix or suffix substring of a full string that comprises one instance of the prefix or suffix substring and a corresponding base string represented by an encoded base-string symbol, the method further comprising:
- fetching a first encoded substring symbol from the database column and a corresponding first encoded base-string symbol from a second column of the database;
- performing the transformation on the first encoded base-string symbol; and
- reconstituting the first full string by concatenating a decoded transformed substring represented by the first encoded substring symbol with a decoded transformed base string represented by the result of performing the transformation on the first encoded base-string symbol.

9. The method of claim 5, further comprising providing at least one support service for at least one of creating, integrating, hosting, maintaining, and deploying computer-readable program code in the computer system, wherein the computer-readable program code in combination with the computer system is configured to implement the receiving, the generating, and the returning.

10. A computer program product, comprising a non-transitory computer-readable hardware storage device having a computer-readable program code stored therein, the program code configured to be executed by a DBMS query-processing system comprising a processor, a memory coupled to the processor, and a non-transitory computer-readable hardware storage device coupled to the processor, the storage device containing program code configured to be run by the processor via the memory to implement a method for a derived data dictionary for optimizing transformations of encoded data, the method comprising:
- the system receiving a query expressly requesting a transformation to be performed upon encoded symbols stored in a database column,
  - where performing the transformation upon any encoded symbol does not require decoding the any encoded symbol upon which the transformation is performed,
  - where each encoded symbol value corresponds to a corresponding unencoded value, and
  - where at least two of the encoded symbol values are indistinguishable;
- the system generating a derived data dictionary (DDD) table,
  - where the DDD table is initialized as a duplicate of a cross-reference table created and maintained by the DBMS,
  - where each entry of the cross-reference table associates one distinct encoded symbol value stored in the column with that distinct symbol's corresponding unencoded value,
  - where each entry of the DDD table associates one distinct symbol value stored in the column with a corresponding transformation result, and
  - where a value of a first transformation result is equal to an output value produced by performing the expressly requested transformation upon a value of a first encoded symbol associated by the DDD table with the first transformation result;
- the system selecting a DDD-generation strategy from the group consisting of:
  - initially populating the DDD table, before fetching any symbols from the column, by adding to each table entry a transformation result derived by performing the transformation upon a symbol value identified by the entry, where the initially further comprises: performing the transformation on each distinct symbol value listed in the DDD table; and storing a result of each transformation as a transformation result in a DDD table entry that identifies a corresponding value upon which the transformation was performed; and
  - incrementally populating the DDD table by adding, to a table entry that identifies a value of a fetched symbol, a transformation result derived by performing the transformation upon the identified symbol value only if a value of the fetched symbol is not equal to a value of any previously fetched symbol, where the incrementally populating further comprises: fetching the first symbol from the database column; determining whether an existing DDD table entry associates a value of the first symbol with the first transformation result; and if determining that no DDD table entry associates the value of the first symbol with the first transformation result, performing the transformation on the value of the first symbol and storing the result of the performed transformation as the first transformation result in the DDD table entry associated with the first symbol; and
- the system returning, for each symbol stored in the column, a corresponding returned result, where a returned result corresponding to a particular symbol is equal to a transformation result associated, by a DDD table entry, with a value of the particular symbol.

11. The computer program product of claim 10, where the selecting a DDD-generation strategy comprises comparing a total number of symbols stored in the column to a total number of distinct symbol values stored in the column.

12. The computer program product of claim 10, where the encoded symbols stored in the database column each represent a prefix or suffix substring of a full string that comprises one instance of the prefix or suffix substring and a corresponding base string represented by an encoded base-string symbol, the method further comprising: fetching a first encoded substring symbol from the database column and a corresponding first encoded base-string symbol from a second column of the database; performing the transformation on the first encoded base-string symbol; and reconstituting the first full string by concatenating a decoded transformed substring represented by the first encoded substring symbol with a decoded transformed base string represented by the result of performing the transformation on the first encoded base-string symbol.

\* \* \* \* \*